(12) United States Patent
Young

(10) Patent No.: US 8,621,335 B2
(45) Date of Patent: Dec. 31, 2013

(54) OPTIMIZED VITERBI DECODER AND GNSS RECEIVER

(75) Inventor: Philip John Young, Northampton (GB)

(73) Assignee: QUALCOMM Incorporated, San Diego, CA (US)

( * ) Notice: Subject to any disclaimer, the term of this patent is extended or adjusted under 35 U.S.C. 154(b) by 290 days.

(21) Appl. No.: 12/680,160

(22) PCT Filed: Oct. 27, 2008

(86) PCT No.: PCT/EP2008/064530
§ 371 (c)(1),
(2), (4) Date: Mar. 25, 2010

(87) PCT Pub. No.: WO2009/053490
PCT Pub. Date: Apr. 30, 2009

(65) Prior Publication Data
US 2010/0299583 A1    Nov. 25, 2010

(30) Foreign Application Priority Data
Oct. 26, 2007   (EP) ..................................... 07119378

(51) Int. Cl.
*H03M 13/03*   (2006.01)

(52) U.S. Cl.
USPC ........... 714/795; 714/794; 714/796; 375/262; 375/341

(58) Field of Classification Search
USPC ........................... 714/794–796; 375/262, 341
See application file for complete search history.

(56) References Cited

U.S. PATENT DOCUMENTS

| | | | | |
|---|---|---|---|---|
| 5,912,908 | A * | 6/1999 | Cesari et al. ................. | 714/795 |
| 5,987,636 | A * | 11/1999 | Bommu et al. .............. | 714/738 |
| 6,029,267 | A * | 2/2000 | Simanapalli et al. ........ | 714/795 |
| 6,272,188 | B1 * | 8/2001 | Mobin et al. ................. | 375/341 |
| 6,301,314 | B1 | 10/2001 | Murayama | |
| 6,788,750 | B1 * | 9/2004 | Reuven et al. ............... | 375/341 |
| 6,868,521 | B2 * | 3/2005 | Cohen .......................... | 714/795 |
| 7,382,831 | B1 * | 6/2008 | Chen et al. .................... | 375/262 |
| 7,398,458 | B2 * | 7/2008 | Ferguson ..................... | 714/796 |
| 7,861,146 | B2 * | 12/2010 | Watanabe et al. ............ | 714/795 |
| 2004/0054958 | A1 | 3/2004 | Ikekawa | |

FOREIGN PATENT DOCUMENTS

| | | | |
|---|---|---|---|
| CN | 1957533 | A | 5/2007 |
| JP | 11346161 | A | 12/1999 |
| JP | 2001060881 | A | 3/2001 |

(Continued)

OTHER PUBLICATIONS

Amulet Group, Dept. of Computer Science, University of Manchester: "An Asynchronous Viterbi Decoder" Internet Article, [Online] 1999, XP002538235 Retrieved from the Internet: URL:http://intranet.cs.man.ac.uk/apt/projects/lowpower/prest/Del4.1.pdf> [retrieved on Jul. 22, 2009].

(Continued)

*Primary Examiner* — Esaw Abraham
(74) *Attorney, Agent, or Firm* — Howard Seo

(57) ABSTRACT

A Viterbi decoder which is based on a special instruction set implemented in the processor, enabling it to handle the Viterbi processing with a much lower CPU loading without significantly increasing the hardware complexity. By careful application of appropriate design constraints specific to the SV navigation and analysis of the Viterbi algorithm an optimised architecture can be realized for embedding Viterbi acceleration logic efficiently into a GNSS chipset.

36 Claims, 6 Drawing Sheets

(56) References Cited

FOREIGN PATENT DOCUMENTS

Figure 1:
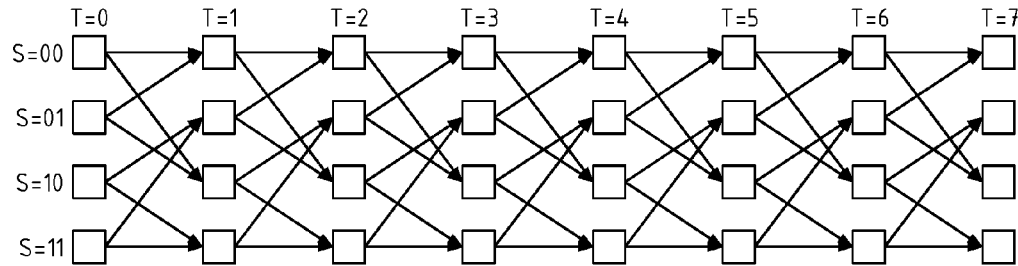

| | | |
|---|---|---|
| JP | 2002217747 A | 8/2002 |
| JP | 2003258650 A | 9/2003 |
| JP | 2004538704 A | 12/2004 |
| JP | 2006041616 A | 2/2006 |
| WO | 9818209 A1 | 4/1998 |
| WO | 03015286 A1 | 2/2003 |

OTHER PUBLICATIONS

International Search Report and Written Opinion—PCT/EP2008/064530—International Search Authority, European Patent Office,Jan. 21, 2011.

Lou H., "Implementing the Viterbi algorithm", IEEE Signal Processing Magazine, Sep. 1995, pp. 42-52, vol. 12, IEEE Signal Processing Society, DOI: 10.1109/79.410439.

* cited by examiner

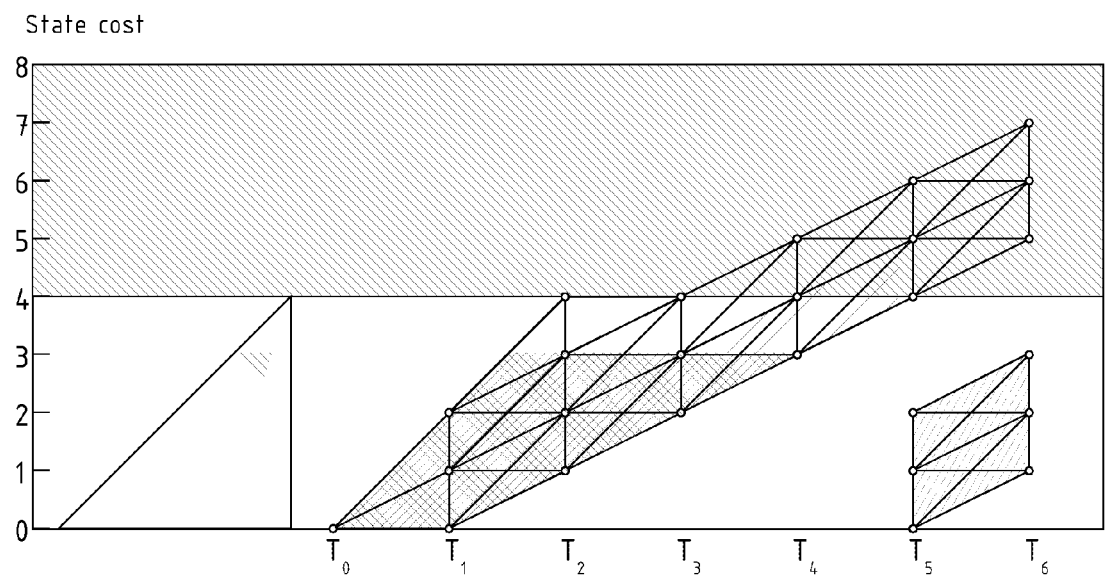
Fig. 5
Fig. 6
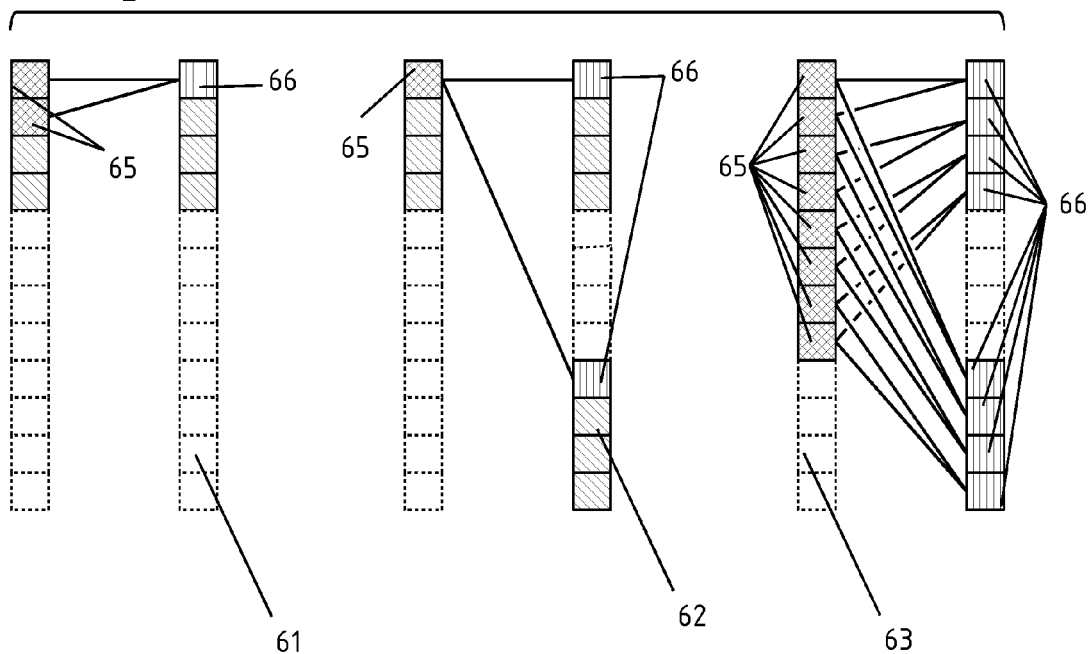

Fig. 7
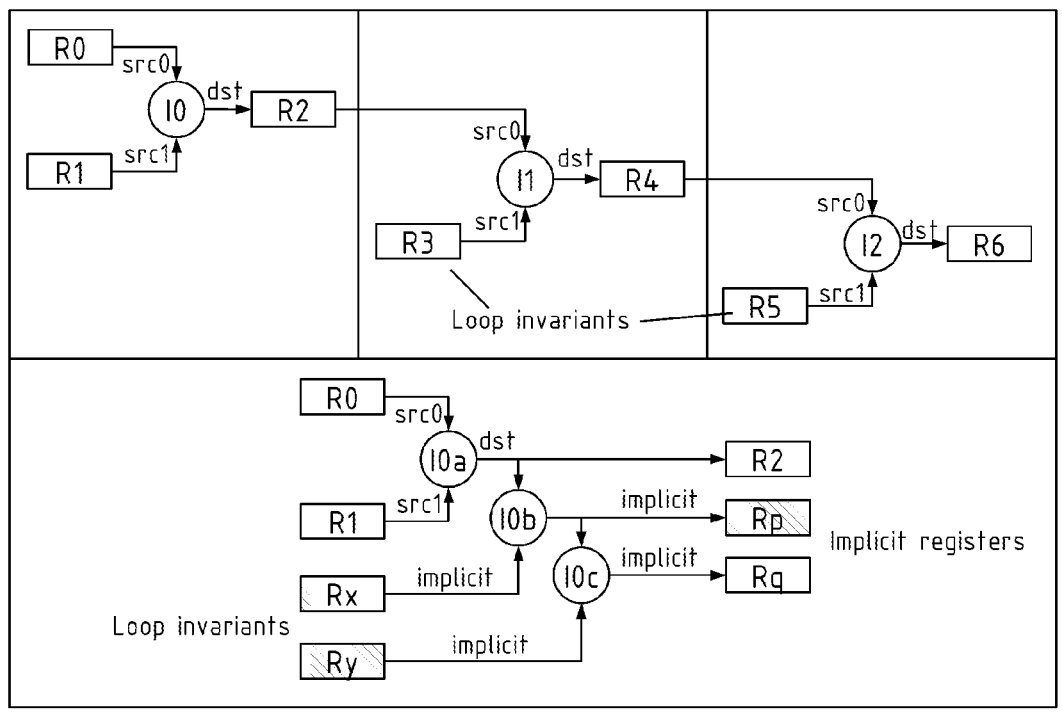
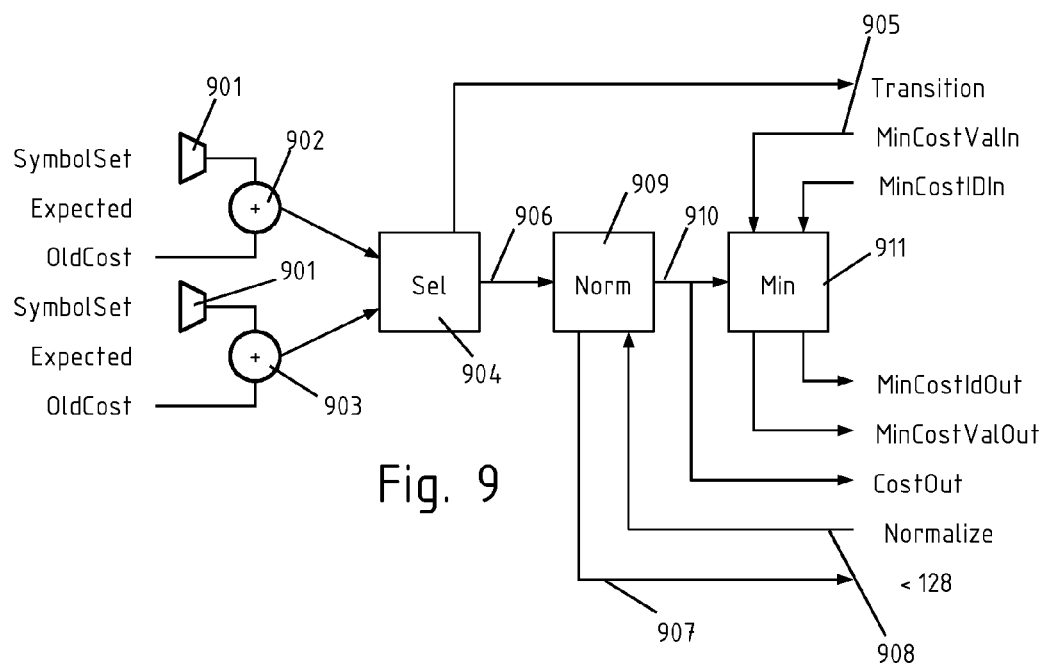
Fig. 9

OPTIMIZED VITERBI DECODER AND GNSS RECEIVER

FIELD OF THE INVENTION

The present invention concerns a receiver for a Global Navigation Satellite System (GNSS) including a receiver to decode convolution-encoded data. In particular, but not exclusively, embodiments of the present invention relate to a GPL receiver able to decode augmentation data transmitted by geostationary satellites, like WAAS/EGNOS satellites, as well as a GALILEO receiver for convolution-encoded data according to the GALILEO standard.

RELATED ART

In GPS the existing Satellite Based Augmentation System (SBAS) Geosynchronous satellites are operated by different nations are used to provide additional information to augment the GPS position fix quality and integrity available from portable GPS receiver devices.

Such information provides additional information on atmospheric corrections which can be applied to improve the quality of the fix, and information about the satellite integrity.

Due to the greater orbital radius, and geo-stationary orbit of the SBAS satellites more complex convolution encoding has been used for the data transfer, this requires more complex decoding capabilities in the receiver, typically a Viterbi decoder, which places an increased processing load on the system. In the case of SBAS implementations Viterbi decoding typically applies to a single SV and it is known to implement it by a software decoder executed by a general-purpose processor. This solution is straightforward, but is sub-optimal as far as speed and power economy are concerned.

The proposed Galileo system signal will also make use of this convolution encoding mechanism for the data channels on all of the SV's in the constellation, utilizing the same basic convolution coding technique, however possibly using a different generator polynomial and symbol rates.

The effect of this new navigation signal format will significantly increase the processing overhead since all Galileo SV's used in the solution will require the Viterbi decode algorithm to be operated simultaneously, so the load of the Viterbi decoders on system resources becomes very significant. Whilst it is theoretically possible to perform all of this in software the processing overhead and additional memory requirements will place additional cost and power requirements on GNSS navigation solutions which are in direct conflict with the market goals of small size, low power, and low cost.

One solution to this is to implement the Viterbi decoders in hardware to offload the processing completely from the processor. While this way of doing reduces the load on the main processor, the cost and power are simply moved into a different subsystem.

There is therefore a need to provide a low-power GNSS receiver able to decode convolutional encoded signals without placing a high load on system resources. The present invention aims moreover to provide a low-power GNSS receiver that can decode convolution-encoding signal faster and using less power than the receivers known in the art.

BRIEF SUMMARY OF THE INVENTION

The goals of the present invention are obtained by the object of the appended claims. In variants of the present invention, this goal is attained by a software Viterbi decoder based on a special instruction set implemented in the processor, enabling it to handle the Viterbi processing with a much lower CPU loading without significantly increasing the hardware complexity.

By careful application of appropriate design constraints specific to the SV navigation and analysis of the Viterbi algorithm an optimised architecture can be realised for embedding Viterbi acceleration logic efficiently into a GNSS chipset.

Moreover, by close integration between hardware and software this can be performed by extending the instruction set of a conventional RISC processor without significant increase in system resources.

SHORT DESCRIPTION OF THE DRAWINGS

Figure 2:
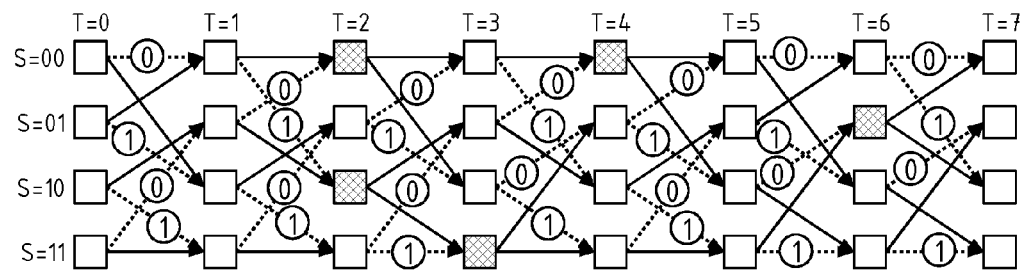
Figure 3:
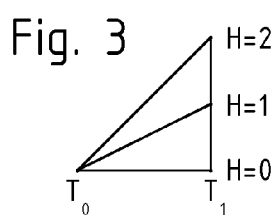
Figure 4:
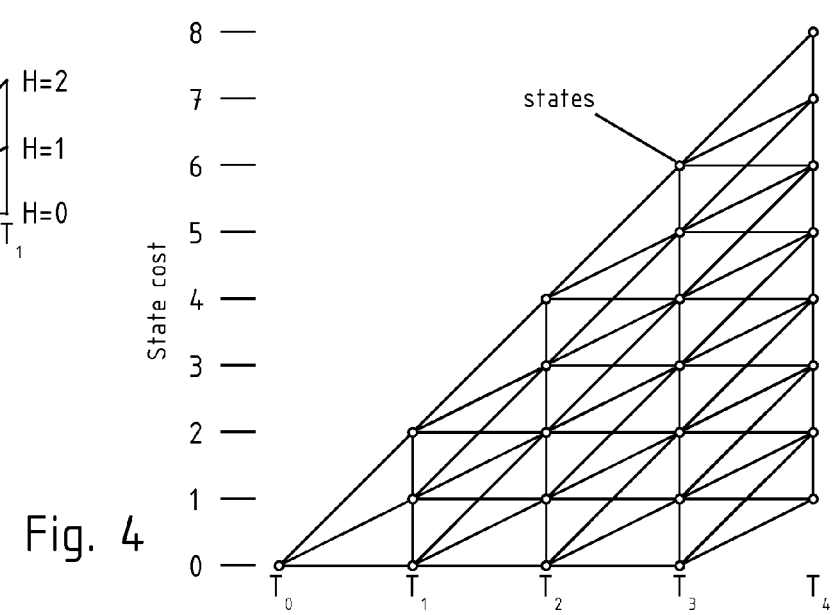
Figure 8:
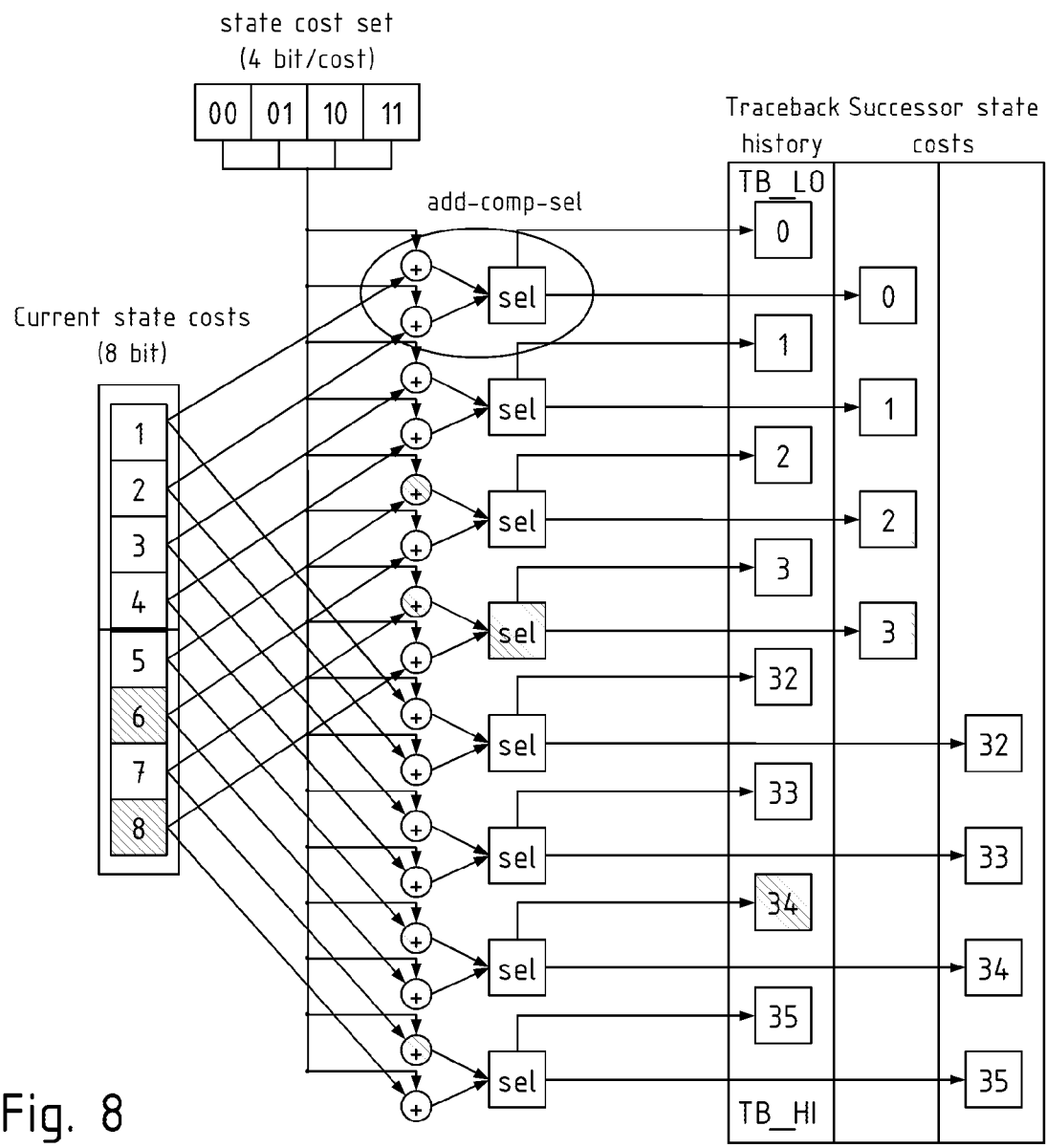
Figure 10:
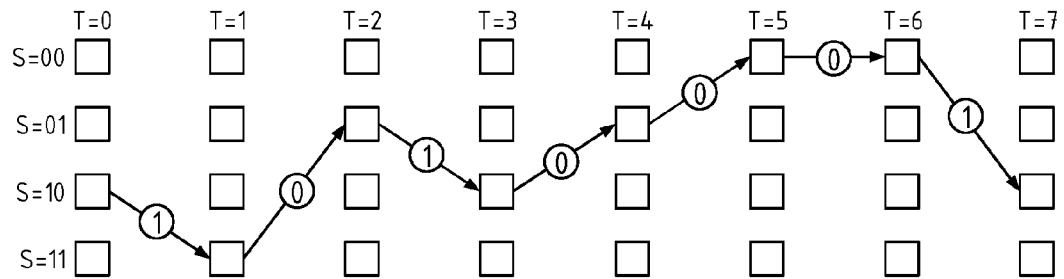
Figure 11:
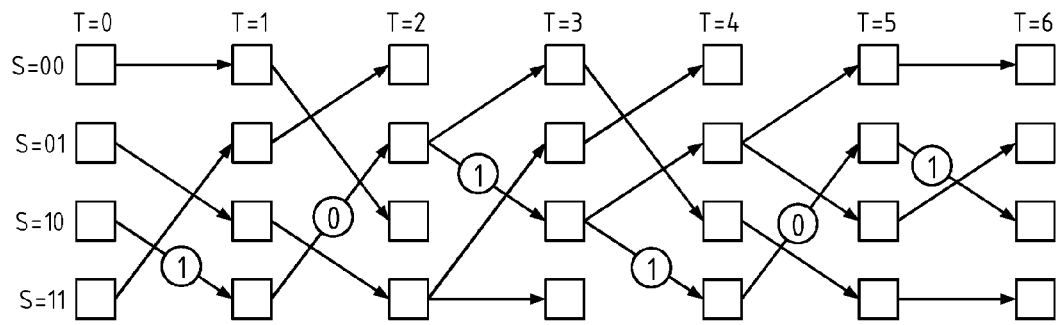
Figure 12:
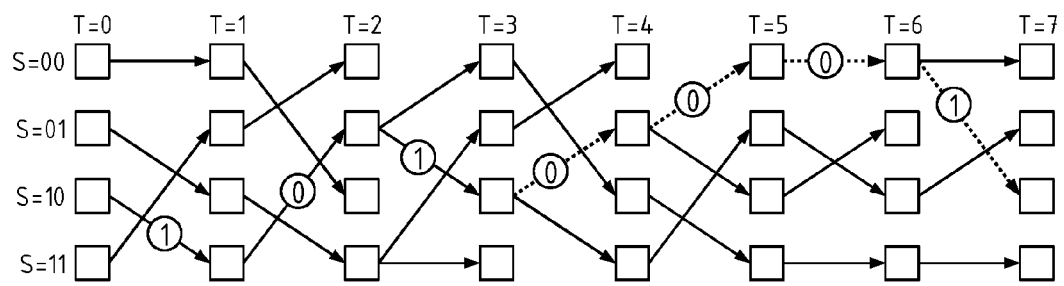
Figure 13:
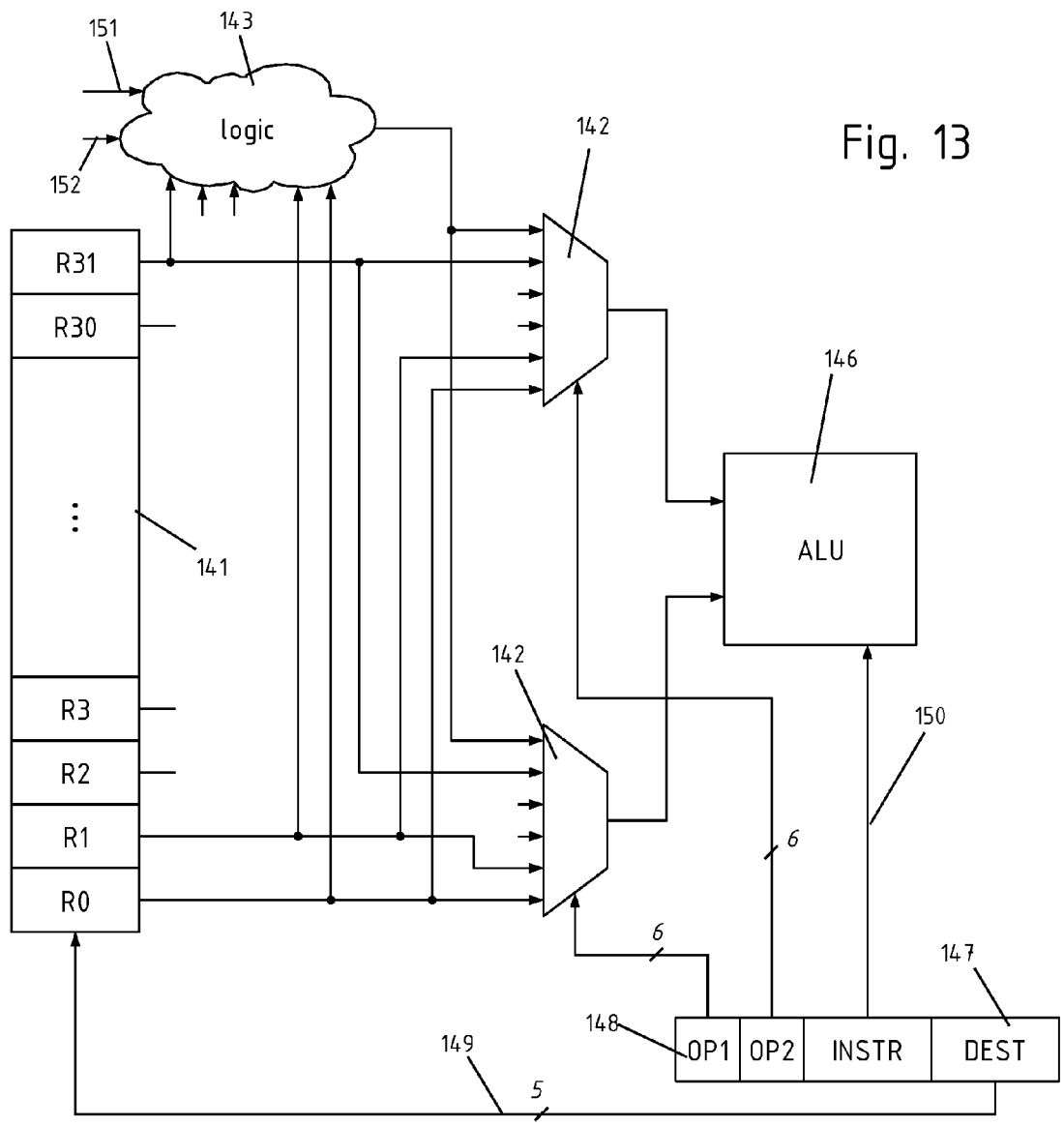

FIG. 1 represents a trellis state diagram
FIG. 2 illustrates a lowest-cost path in the diagram of FIG. 1
FIG. 3 represents the calculation of the Hamming distance
FIG. 4 Illustrate a cost distribution
FIG. 5 illustrates a cumulative state cost diagram
FIG. 6 shows schematically different data access method in the Viterbi algorithm
FIG. 7 illustrates a instruction architecture relative to an embodiment of the present invention.
FIGS. 8 and 9 relate to an implicit addressing of the instruction relative to the present invention.
FIG. 10 illustrate a sequence of transmitted bits.
FIGS. 11 and 12 represent a decoding of the sequence of bits of FIG. 10.
FIG. 13 illustrates schematically the operation of a processor with a special instruction set according to an aspect of the invention.

DETAILED DESCRIPTION OF THE INVENTION

Viterbi encoding and decoding algorithms are generally known in the art and described in the technical literature. In the following only the aspects specific to GNSS implementation will be discussed.

Several criteria must be considered in Viterbi implementation: the symbol size, symbol interpretation, generator polynomial and length, and the symbol rate. For GNSS application the constraint length $K=7$, (memory $m=6$), meaning that the transmitted symbol is a function of the current data bit and the previous six data bits, the code rate is two, meaning that for each data bit two symbols are transmitted, the symbol rates are generally around 250 or 500 symbols/second, and the generator polynomial may vary.

Viterbi is a convolutional coding and decoding technique which operates on a path cost table computing the maximum likelihood of being in a particular state based on potential interpretations of the previously received symbols. Since the polynomial is length seven the implementation requires 62 states representing the previous six data bits.

The convolutional code used produces two bit symbols for each data bit transmitted which is represented as a transition between two states, and has 64 states ($K=7$), from each state there are two possible next states represented by two potential symbols, and for each state there are two potential symbols which can never be transmitted. The actual symbols transmitted for a data bit are determined by the generator polynomial and are a function of the previous 6 data bits and the bit being transmitted.

For each data state therefore the symbol is determined by the polynomial, and the states are predictable as follows: If the bit is a "1" the next state is 32+(current_state/2), otherwise it is simply current_state/2, hence no state transition table is required.

As each symbol is transmitted the representation is thus determined by seven data bits, and when it is received it is interpreted by the decoder based on the polynomial and the previous six data bits. As each symbol is received it is interpreted and awarded a probability value based on its similarity to the potentially valid symbols and used to calculate a probability of a certain symbol sequence interpretation being correct.

To achieve this the Viterbi decoder keeps a record of the lowest cost path found for all possible states, and for each possible state it records the previously most likely sequence of symbols being received and their cumulative cost.

Once sufficient symbols have been received the data is decoded by picking the lowest cost state and working back through the history to determine the sequence of data bits that were most likely transmitted to lead to that state.

The principles of Viterbi encoding and decoding are generally understood by people familiar with convolutional coding mechanism's and available analysis shows that the overall SNR improvements gained by these schemes benefit from awarding a range of potential values to each symbol, rather than a simple binary decision, and that typically significant gains can be achieved with up to an eight level interpretation for each symbol.

For K=7 the usual Viterbi decoding algorithms require processing of at least 35 symbols before we can extract the first data bit for the optimum performance, for this processing we need to keep at least two sets of state information representing the cumulative costs of being in a particular state, and for each state we need to keep a record of typically the previous 34 transitions (data bits) leading to that state for optimal decoding performance.

Given these constraints we can first select appropriate minimal data structures to represent the Viterbi decode states and then optimize these for embedded implementation, giving specific consideration to the HW/SW interaction and the processor subsystem architecture.

In each potential current state there are two valid state transitions (branches) represented by two symbol encodings, and there are two symbol encodings representing invalid transitions, thus for each state there are only two potential successor states, and two potential predecessor states. These can be represented by the trellis diagram of FIG. 1.

Depending on each potential current state the valid and invalid branches are indicated by different symbols, thus for each state we require to know the two potential next states (which can be calculated trivially) and the appropriate symbols associates with the branches which could also be calculated using dedicated logic, but can more easily be loaded form a table thus making the implementation independent of the polynomial Since we are implementing a soft decision decoder we first need to determine a cost factor for all potential symbol pairs weighted according to the strength of the received symbols, and since all valid state transitions for all states have equal probability this weighting is independent of the current state and is only dependant on the received symbol pair and the Hamming distance between the received symbol pair and the actual symbol pair associated with the branch. This means that for each symbol the software must calculate a weighting table associated with the Hamming distance, and this can then be applied to all states and branch cost calculations using a mapping between the Hamming distances and states.

The basic Viterbi algorithm will thus perform the following sequence of calculations for each symbol pair received, the actual implementations will parallelize these processes to minimize the loads/stores and complex instruction sequences by careful design of the associated data structures and the implementation of custom instructions where appropriate.

For the received symbol pair calculate a set of four costs associated with the Hamming code between the symbol pairs interpretation and the four possible transmitted symbol pairs. The Hamming cost table is effectively a table of four values representing the cost associated with interpreting the actual received input symbol pair in each possible way, i.e. 00, 01, 10, 11.

For each potential current state (64 states) calculate the costs of reaching each of the next states (branch cost) for each of the two potential interpretation of the received symbol pair, this is based on the states current cost and the pre-calculated cost table for the received symbol, i.e. for each state there are two potential next states and two transitions with associated costs based on the required symbol pair and its re-interpretation as the symbol associated with the transition.

For each of the successor states, select the transition into the state with the lowest cost and update the trace history for the state to record the cost of getting to the state and the transition which arrived there ("1" or "0") representing the transmitted data bit.

The result is a table of the lowest cost achievable for each state and the path to get there as shown in figure two.

Finally, once sufficient symbols have been decoded select the state with the lowest cumulative cost and trace back through the transitions into each state to recover the lowest cost data sequence which arrived in that state, this is the Viterbi decoding of the received bit stream.

It is clear from this that Viterbi decoding is a data intensive operation, and also involves accessing the data in a non sequential order, generally referred to as the Viterbi butterfly due to the pattern formed when the data access order is drawn.

Generally Viterbi acceleration is performed using a Viterbi Butterfly operation using multiple memories for efficiency, and dedicated hardware performing the well known add-compare-select operation. Although the add-compare-select operation can easily be accelerated and is often supported by custom instructions in a DSP, accelerating this alone does not greatly improve the speed since the operation becomes data access dominated, usually with the effective address calculation taking as much time as the data access itself.

Typically DSP's have custom instructions for calculating the addresses and add-compare-select instructions for the path cost calculations Optimization and Data Representation.

Due to the nature of the convolution algorithm the state transitions are predictable, and can be grouped into partially independent data sets, that is for each pair of potential successor states there are exactly 4 current states which could have led to them, thus an optimum architecture for memory access should be able to operate on this data set independently of all other data sets to minimize memory accesses.

Since there are two potential current states leading to each potential successor state, and there are two potential symbols associated with any current state it follows that there are a maximum of 128 branches to be calculated. For each symbol pair there are four possible interpretations, thus two bits associated with each potential branch to indicate the corresponding symbol pair, thus we can store the branch cost mapping for eight states (16 branches) in one word.

For any branch there are four possible symbols, and for each state there are two possible branches, thus the branches must differ by at least one symbol, since the maximum symbol cost is therefore 14. Since the channel is not perfect there will inevitably be symbol errors, hence the reason for the convolutional code being used, there will be cumulative errors over time with a maximum value determined by the block length used.

Since the maximum difference between a symbol transmitted and received is 14, for all symbols the maximum value for the lowest cost state after N data bits will be less than 8N, depending on the polynomial used.

For a given data bit transmitted in a given state there are two symbol bits transmitted from a possible four combinations, assume for now that these are binary representations although the principal can be extended to a soft decision. Comparing the received symbol against the transmitted symbol and counting the differences for each possible interpretation we calculate the hamming distance, 0 for the correct interpretation, 1 if one of the symbol bits is incorrect, 2 if both bits are incorrect. FIG. 3 shows this.

For each possible state we calculate the potential costs of being in each possible successor state and keep the lowest cost, over time the range of possible state costs expands due to the errors in the signal and the possible interpretations, one of which is always wrong by definition.

Assuming we have a perfect signal we will see the costs distribution change as shown in FIG. 4.

However, since there are only a finite number of memory bits in the decoder, it follows that if there are K bits, then every state can be reachable in K steps from every previous state, even if it means misinterpreting every received symbol; this allows us to construct the cumulative costs as shown in the diagram of FIG. 5.

For simplicity we assume that there are only two memory bits, hence the triangle on the left shows the maximum distribution of costs for any state 51 derived from the current state SO at time T+2 showing that the a maximum cost that can be obtained in K steps where K is the number of memory bits is, in this case, M=4. In the signal state transition diagram we indicated the presence of noise after state T1 such that every symbol has at least one error (H=I), then applied the constraints of the two bit memory and masked the potential range of costs for all states based on the worst possible interpretation of the previous two symbols.

At T4 all costs are not below the maximum state cost of M=4, so at T5 we can adjust all new costs by subtracting a common offset, thus constraining the range of the cost results. Thereby the method of the invention includes a step of setting the transition costs to non-negative values in the range 0 to M, where M is the maximum cost that can be obtained in K steps where K is the number of memory bits in the convolutional encoded data. Preferably N bits are allocated per cumulative path cost where $(2^{(K+1)}*M)-1<2^N-1$.

For any state Sn the predecessor states are S(2n) and S(2n+1). Let Hn0/1 be the Hamming costs of interpreting the symbol as a 0/1 respectively in state n.

Let C(N) represent the lowest cumulative path cost of state N,

Let KT represent the set of C0 ... C63 at time T

Assuming we have a set of state costs KT0 at time T0 and at a future time T1 we have a set of associated costs KT1. It follows that Min(KT1)>=Min(KT0) and Max(KT1)<=Min(KT0)+84. For data recovery to start we care about the index of the smallest member of KTn, but not the actual values of KT it follows that we can constrain the costs KT by normalizing them to some value<=Min(KT).

Thus we need seven bits to represent the accumulated state transition costs, so for alignment with the CPU architecture it is convenient to store the accumulated costs as eight bit values, this allowing packing the costs for the four possible interpretation of a symbol pair into a 32 bit word.

To avoid overflow of the accumulated costs it is therefore necessary to scale them when any state approaches overflow, provided we have sufficient range to uniquely represent all values within KT and preserve their ordering. To achieve this each accumulated cost will be represented as an eight bit value, and as costs are accumulated for all state transitions they cannot diverge by more than 84, this enables the cost adjustment to be performed by constraining all values to be between less than 256 which is easily achieved by resetting the MSB of all state costs when the lowest state cost reaches 128 prior to accumulation with the new transition costs.

Now that data representation has been determined it is desirable to optimize the processing of the data to minimize the overhead of memory accesses.

The calculation of the branch costs for any state involves calculating the potential costs of the two paths than lead to it Cn=

Since there are two potential branches into each successor state it is preferable to calculate these transitions simultaneously so that the lowest cost branch can be detected and stored without the need to store intermediate values.

Viterbi operates using its result as source data for the next iteration, consequently it is necessary to organize the results in the same order as the operands, this implies a linear array of state costs occupying 64 bytes, (16 32 bit words).

Since we can store four state costs in one word it is desirable to read the word once and process all states within it before discarding it and write the results back directly into the same type of structure, using two copies of the structure and alternating which is the input and output.

With this organization each word processed produces four new states which are in two groups that do not fit into the same word in the output array, however processing two consecutive source words will produce eight results in two groups where each group fits into a single word, but the two words are not contiguous.

Thus for the Viterbi operation we need to process eight states as eight groups of two words, and since each state requires 4 bits in the mapping register we can pack the mapping register so that each group also requires one 32 bit register to contain this mapping.

This fits nicely into an eight iteration loop, processing eight states per loop, where all data required fills a CPU register, each operand is read once per loop, and each result is written one with no partial word updates required, thus memory efficiency is optimized.

For each new state the lowest cost branch must be recorded, this requires 64 bits which will fit neatly into a pair of 32 bit registers, these will need to be partially updated for each loop iteration and stored to the history or 'traceback' table after completion of the loop.

We also need to calculate the index of the lowest cost state, and detect when all states are above a minimum threshold so that we can adjust them on the next loop iteration, this is easily achieved using a flag to indicate all states are above 128 and masking the MSB on the next iteration.

During iteration of the loop we need to address the source and result data efficiently, but the addressing is a simple function of the loop index, as are the field to update in the traceback registers, so an ideal extension will include registers for the loop index, addressing, lowest cost state index, and normalization flag. FIG. 6 shows the different methods in which data can be accessed for the Viterbi loop, in the diagram 61 two source values 56 are used to produce one result 66, this is inefficient because it does not utilize all the source data. In the case illustrated in diagram 62, one source operand 65 is used to calculate two costs 66, but these relate to different states in different words and, in the third diagram 63, eight states 65 in two words are utilized to compute eight new states 66 in two words, all data is perfectly aligned and no data is wasted.

Overall this leads to an ideal implementation that requires multiple source and destination registers which cannot be implemented easily using a typical instruction set architecture, as FIG. 7 below shows.

FIG. 7 illustrates a typical sequence of operations to calculate 3 results from 4 source variables. The upper diagram shows how these would typically be implemented on a standard 3 operand CPU, where the 3 operands would represent 2 source operands and 1 destination operand. Here it can be seen that the operation must be divided into at least 3 sequential instructions. This is due to the instruction operand format restrictions which do not allow sufficient bits for the encoding of sufficient registers, and also generally would be a limitation of the ability of the register file to accept more than 1 write operation in a cycle. In this encoding all registers are explicitly coded in each opcode and all register exist in the general register file.

In the lower part the same operation is illustrated using implicit encoding of some of the registers, and the implementation of these special fields as dedicated registers separate to the general purpose register file.

FIGS. 8 and 9 relate to an aspect of the present invention in which the optimal approach of FIG. 3 is obtained by making the register addressing implicit in the instructions.

The diagram of FIG. 9 shows the actual function implemented by the Viterbi instructions. In this figure a pair of previous states (Sa, Sb) are selected corresponding to the pair of potential predecessor states for the new state Sc. The corresponding costs of interpreting the new symbol in such a way that it would lead to the new state are selected by multiplexors (901) and added to the corresponding costs of these previous states by adders (902) producing a pair of potential costs (903) of arriving at state Sc. These costs are compared and the lowest costs predecessor state selected by selector (904), the corresponding bit transition is indicated (905) and the corresponding cost is output (906). This corresponding costs will potentially increase for each state as each new symbol is applied however as the state memory is limited to a finite number of states (in this case 6 states) there is a set of values at any instance corresponding to the costs of all states where the range between the minimum and maximum values is limited by the maximum state transition costs and the maximum state memory. In this example this is less than 64, so to prevent the state costs growing indefinitely an indication is output when any state cost exceeds 128 (907).

The indication that at least one of the previous state costs was >128 (908) is supplied to the normalize block 909 and this normalizes the state cost by subtracting 64, this guarantees that all state costs will remain within a finite integer range.

The resulting new state cost 910 is output from the instruction and also used by the minimum cost block 911. The purpose of this block is to monitor all state costs calculated during a new symbol processing and determine the lowest costs of all the resulting set of new state costs.

Once the transition that led to a state has been determined the new cost for that state is calculated and the state cost table updated New symbol is supplied, each of the associated costs of interpreting the symbol as a 1 or 0 is selected by multiplexors 901, these costs are added to the previous symbol costs in adders 902 producing a pair of costs 903 associated with the 2 possible interpretations of the symbol.

Since several of the results and control variables are less than 32 bits in length these can be merged into sub-fields of a single 32 bit core register.

To enable operation of the instruction set extension in multiple pre-emptive tasks it is also necessary to save these registers and any status, this is further simplified if these status flags are also merged into the same control register.

Once sufficient symbols have been processed it is necessary to perform a traceback operation to determine the sequence of branches leading to the current state. This is a relatively simple operation but again involves significant address calculation, bit manipulation, and data load operations. Again these can be efficiently implemented using a dedicated instruction to perform each traceback step and dedicated registers for the addressing of the traceback history.

Consider the sequence of bits transmitted in the trellis diagram of FIG. 10. In this encoding Rx and Ry represent 2 of the 4 required source operands which exist in special registers outside of the general purpose register file, and Rp, Rq represent 2 of the results which are saved in special registers outside of the register file and may therefore be sub-fields of a register and may even overlap with Rx and Ry.

After transmitting the data the receiver calculates costs and traceback and achieves the cost and traceback history of FIG. 2.

If the traceback starts at T=6 and finds state 10 to be the lowest cost state, the receiver decodes the sequence 101101, which is in the reverse order that data was transmitted and then needs to be reversed as in FIG. 11

After receiving another symbol and starting again from the lowest cost path which assume is state "10" again, the receiver now decodes 1000101, as shown in FIG. 12; clearly after a few symbols the paths converged and it was not necessary to trace back further than state T=3

During traceback the path will often not change significantly after each new symbol is added, apart from being offset by 1 bit, it is also apparent that once the new traceback history converges on a state in the previous history they will never diverge again, consequently it is possible to reduce the effort spent in traceback by detecting convergence with the previous traceback operation. In SW this is a complex task involving masking and rotation of bit fields prior to comparison, the overhead of this adds sufficient extra cycles to each iteration that its benefits are negated, however using dedicated hardware to access these bit field using the traceback index to select the field means that it can be performed transparently and greatly reduce the power and cycles consumed by the traceback operation.

Once a traceback has been performed the oldest data bits are extracted usually 1 byte at a time, however during the initial phase typically a synchronization pattern is being searched for and bit alignment is not known, this further complicates the initial traceback operation for SW but again can be optimized by adding specific instructions to extract the oldest bits in the correct order aligned into a CPU register, and a separate instruction to "consume" a number of bits when they have been used, in this way bytes can be extracted and compared discarding one bit at a time until the synchronization has been detected, thereafter consuming bits at the rate they are processed by the application.

As a final function, each of the Viterbi process requires a data structure containing the Viterbi status, traceback history, traceback table, and state cost tables. These need to be separated for each channel and therefore all addresses will require some offset. This can again be hidden from the processor by implementing a Viterbi data structure base address as part of the Viterbi control/status word.

In order to minimize impact on other processes it is preferable that the implicit Viterbi registers be in addition to the core cpu registers, and that the SW be able to efficiently save their state when context switching, however most processes will not use these registers therefore they do not need to save them.

In order to minimize the number of times that they are saved, without the OS needing to know for each process whether they are required, additional status bits can be added to the Viterbi status/control register to indicate when the Viterbi block is in use, these may be automatically set/cleared by the Viterbi instructions according to the status of the process, in this way context switching can test these flags to determine if there is any context to be saved, in this way they do not take valuable stack space from processes that do not use the functionality and they are not stored if they are not actively in use thus the Viterbi can be efficiently used in a multi-threaded environment.

According to another aspect of the invention, the present invention relates to a processor optimized for the decoding of convolutional encoded data according to the methods of the invention described above. The processor is arranged to extend the register set of the processor with phantom registers which do not physically have any register storage, but return addresses for the source and destination state cost operands based on a core register field used as the loop control register and a state register field indicating the current state cost set allocation and a base address for the data structures and selecting the mapping of current and next state tables.

With reference to FIG. 13, the operation of the processor of the invention is controlled by instruction stored in memory in the form of single words (or opcodes) comprising multiple fields. In the illustrated example, for example, opcode 147 illustrates a typical 3 operand instruction consisting of two source operands 148, an instruction field 150 and a destination register address (149).

Operands OP1, OP2 are used to select the two source operands from the register file 141 by means of the multiplexor 142 that are passed to the ALU 146, The output of the ALU is typically written back into the register file 141 using address 149 through a path not illustrated.

In the illustrated example the register file 141 comprises 32 locations or registers R0-R31, but this is not a limitation of the invention. It must be understood also that FIG. 14 is a simplified functional diagram meant to illustrate the logical data flow in the processor and it does not limit the structure of the processor of the invention. In particular the invention also includes pipelined architectures, in which these operations are performed at different times.

According to the invention, the opcode 147 can include addresses to "phantom registers" 143 which do not correspond to a separate storage space in the register file, 141, but rather are a logical function of the values In the registers R0-R31 and/or additional values 151, 152 internal or external to the CPU. When addressed by an instruction, the phantom register or registers return a value calculated from signals and/or registers not explicitly addressed by the instruction.

Opcode 147 stores the operand addresses 148 with 6 bits each, in this example, thus giving the ability to address more operands than the thirty-two physical registers. The phantom registers are accessible, for example, by encoding one of the addresses that has no counterpart in the register file 141.

Whilst the diagram of FIG. 14 shows the typical format and processing of an arithmetic instruction, a CPU has typically also non-arithmetic instruction, for example load/store instruction. According to the invention, the operand of these instructions could be a phantom register 143 as well. It is also intended that the invention may include a plurality of phantom registers, and that they might interact with each other, for example with some phantom registers depending, among others, from values of other phantom registers. The invention also includes the case in which some phantom registers are related to independent memory elements, and that they may retain a status such as additional hidden registers.

Advantageously, the phantom registers are arranged to return addresses for the source and destination state cost operands based on a core register field used as the loop control register and a state register field indicating the current state cost set allocation and a base address for the data structures and selecting the mapping of current and next state tables.

The invention claimed is:

1. A method of improving the efficiency of decoding convolutional encoded data in Viterbi decoders, comprising:
    setting a transition cost to non-negative values in a range 0 to M, where M is the maximum cost that is obtained in K steps where K is the number of memory bits in the convolutional encoded data; and
    allocating N bits per cumulative path cost where $(2^{\wedge}(K+1)*M)-1 < 2^{\wedge}N-1$.

2. The method of claim 1, further comprising calculating a set of costs for the 4 possible interpretations of a symbol pair and packing these into a single 32 bit word which can be indexed as 4 byte fields.

3. The method of claim 1, further comprising utilizing one or more pairs of 2 bit fields in one CPU register to selectively access one or more pairs of sub-fields from at least another register.

4. The method of claim 1, wherein setting the transition cost relates to branch transitions and branch costs for a state.

5. The method of claim 1 wherein normalized cumulative state costs for all states are represented by 8 bit fields stored in consecutive locations in memory such that each 32 bit memory word contains the costs associated with 4 consecutive possible states.

6. The method of claim 1, further comprising representing the valid path transition symbols associated with each potential state using a packed structure of 2 bits per symbol where these are organized in CPU memory such that each successive address holds the state transition symbols representing the valid symbols for 0 and 1 data bits corresponding to 8 current states represented in 2 consecutive 32 bit memory locations.

7. A method of reducing costs in Viterbi decoding convolution-encoded data, comprising:
    processing 64 Viterbi states in 8 iterations of a loop with CPU operands, where each iteration processes 8 consecutive current states, and;
    storing associated state symbol interpretation costs to be represented as loop invariants in one 32 bit core register; and
    storing transition information for the loop in a second register.

8. The method of claim 7 wherein addressing to access the required data for each loop iteration is performed implicitly by changing a single register such that the change to this register makes available required addresses for source and destination state costs locations and associated transition interpretation information.

9. A processor optimized for the decoding of convolutional encoded data configured to:
    set a transition cost to non-negative values in a range 0 to M, where M is the maximum cost that is obtained in K steps where K is the number of memory bits in the convolutional encoded data; and allocating N bits per cumulative path cost where $(2^{(K+1)}*M)-1 < 2^N-1$;

wherein the processor is arranged to extend the register set of the processor with phantom registers which, when addressed by an instruction, return a value calculated from signals and/or registers not explicitly addressed by the instruction.

10. The processor of claim 9, wherein the phantom registers are arranged to return addresses for the source and destination state cost operands based on a core register field used as the loop control register and a state register field indicating the current state cost set allocation and a base address for the data structures and selecting the mapping of current and next state tables.

11. The processor of claim 9, wherein the instructions set a flag in a core register or status register automatically based on the loads and stores of the registers in the Viterbi Engine, where this flag indicate if a Viterbi operation is partially completed, enabling the processor to determine if the Viterbi engine is in use when storing/restoring the CPU registers on context change.

12. A processor for decoding convolutional encoded data configured to:

set a transition cost to non-negative values in a range 0 to M, where M is the maximum cost that is obtained in K steps where K is the number of memory bits in the convolutional encoded data; and allocating N bits per cumulative path cost where $(2^{(K+1)}*M)-1 < 2^N-1$;

wherein the processor is arranged to execute an instruction to implement the add-compare-select operation which operates on multiple operands stored in the core data registers where the instruction utilizes additional CPU registers which are implicitly addressed by the instruction allowing a SIMD architecture to be implemented without violating the constraints of the processors Instruction Set Architecture.

13. The processor of claim 12, in which the instruction performs one or more add-compare-select operations simultaneously and updates the relevant state cost fields for the appropriate states which may be stored in multiple destination registers.

14. The processor of claim 13, in which the same instruction simultaneously performs calculation of the lowest cumulative cost state for the loop.

15. The processor of claim 13, in which the same instruction simultaneously calculates whether the lowest cost state result for the loop is greater than a pre-determined threshold.

16. The processor of claim 15, wherein the threshold is represented as a power of 2 and a subtraction is performed by masking an associated bit to 0 based on a status flag, which may be stored in a CPU register.

17. The processor of claim 13 wherein the same instruction subtracts a pre-determined threshold value from the calculated state costs prior to storing them.

18. A processor for decoding convolutional encoded data, comprising an instruction extension, the instruction extension being configured for:

implementing a traceback operation where a traceback history is represented in a pair of core CPU registers and the instruction is able to specifically set/clear bits in the traceback history based on a traceback state;

counting an index to the bit to be set/cleared on each operation of the instruction; and detecting if the traceback history has been changed by a current step and set a flag to terminate the traceback operation on convergence with a previous value.

19. The processor of claim 18, where a CPU register field is automatically updated by the same instruction to indicate the number of valid bits in the traceback history.

20. A processor for decoding convolutional encoded data, comprising:

a phantom register based on a traceback state and address of a data structure in system memory where the register returns a correct address for a next 32 bit traceback history word to be read;

where the phantom register is used by a CPU as an address register for an indirect load; and the address is a function of the current traceback state and traceback sample index.

21. A processor for decoding convolutional encoded data, arranged to execute an instruction to:

retrieve the oldest bits of the traceback data in a correct bit order representative of the transmitted data; and to detect if the oldest bits of the traceback data have been changed by a current step, and set a flag to terminate the retrieval on convergence with a previous value if the detection is true;

where an address of a field returned from the traceback data is determined implicitly by a traceback control register.

22. A processor for decoding convolutional encoded data, the processor configured to execute an instruction to consume a number of bits from a traceback data; and to detect if the traceback data has been changed by a current step, and set a flag to terminate the consumption on convergence with a previous value if the detection is true;

wherein the processor automatically updates a traceback count field of a traceback control register.

23. A GNSS receiver for determining a geographic position based on a signal received by a plurality of radio localization beacons, the beacons derived from localization satellites, wherein some of the data contained in said signal are encoded according to a convolutional code, and wherein the receiver includes a processor configured to:

set a transition cost to non-negative values in a range 0 to M, where M is the maximum cost that is obtained in K steps where K is the number of memory bits in the convolutional encoded data; and allocating N bits per cumulative path cost where $(2^{(K+1)}*M)-1 < 2^N-1$;

wherein the processor is arranged to:

extend the register set of the processor with phantom registers which, when addressed by an instruction, return a value calculated from signals and/or registers not explicitly addressed by the instruction; and execute software programs containing special instructions to decode said convolutional code.

24. The receiver of claim 23, in which at least some of said special instructions include an instruction to implement simultaneously the add-compare-select operation of a Viterbi decoding algorithm, said instruction operating on multiple core data registers and utilizes additional core CPU registers which are implicitly addressed.

25. The receiver of claim 24, wherein said instruction simultaneously performs calculation of the lowest cumulative cost state for the Viterbi loop of the Viterbi decoding algorithm.

26. The receiver of any of claim 23, in which said instruction includes setting a flag in a core register or status register automatically based on the loads and stores of the registers in the Viterbi Engine, where these flags indicate if a Viterbi operation is partially completed, enabling the processor to determine if the Viterbi engine is in use when storing/restoring the CPU registers on context change.

27. The receiver of claim 23, further comprising a phantom register based on the traceback state of the Viterbi algorithm and address of the data structure in system memory where the register returns the correct address for the next 32 bit traceback history word to be read, where the phantom register can be used by the CPU as an address register for an indirect load, and the address is a function of the current traceback state and traceback sample index.

28. The receiver of claim 23, wherein the decoding of said convolutional code includes the computation of transition costs between data states, and in which the transition are represented as non-negative values in the range 0 to M, where M is the maximum cost that can be obtained in K steps where K is the number of memory bits in the convolutional encoded data, and allocating N bits per cumulative path cost where $(2^{(K+1)}*M)-1<2^N-1$.

29. An apparatus configured to decode convolutional encoded data in Viterbi decoders, comprising:
   means for setting a transition cost to non-negative values in a range 0 to M, where M is the maximum cost that is obtained in K steps where K is the number of memory bits in the convolutional encoded data; and
   means for allocating N bits per cumulative path cost where $(2^{(K+1)}*M)-1<2^N-1$.

30. The apparatus of claim 29, further comprising means for calculating a set of costs for the 4 possible interpretations of a symbol pair and packing these into a single 32 bit word which is indexed as 4 byte fields.

31. The apparatus of claim 29, further comprising means for utilizing one or more pairs of 2 bit fields in one CPU register to selectively access one or more pairs of sub-fields from at least another register.

32. The apparatus of claim 29, further comprising means for representing valid path transition symbols associated with each potential state using a packed structure of 2 bits per symbol where these are organized in CPU memory such that each successive address holds the state transition symbols representing the valid symbols for 0 and 1 data bits corresponding to 8 current states represented in 2 consecutive 32 bit memory locations.

33. A computer program product residing on a processor-readable medium and comprising processor-readable instructions configured to cause a processor to:
   set a transition cost to non-negative values in a range 0 to M, where M is the maximum cost that is obtained in K steps where K is the number of memory bits in the convolutional encoded data; and
   allocate N bits per cumulative path cost where $(2^{(K+1)}*M)-1<2^N-1$.

34. The computer program product of claim 33, wherein the processor-readable instructions further cause the processor to calculate a set of costs for the 4 possible interpretations of a symbol pair and packing these into a single 32 bit word which can be indexed as 4 byte fields.

35. The computer program product of claim 33, wherein the processor-readable instructions further cause the processor to utilize one or more pairs of 2 bit fields in one CPU register to selectively access one or more pairs of sub-fields from at least another register.

36. The computer program product of claim 33, wherein the processor-readable instructions further cause the processor to represent valid path transition symbols associated with each potential state using a packed structure of 2 bits per symbol where these are organized in CPU memory such that each successive address holds the state transition symbols representing the valid symbols for 0 and 1 data bits corresponding to 8 current states represented in 2 consecutive 32 bit memory locations.

\* \* \* \* \*